United States Patent
Shirosaki et al.

(10) Patent No.: US 6,809,001 B2
(45) Date of Patent: Oct. 26, 2004

(54) SEMICONDUCTOR DEVICE AND METHOD FOR PRODUCING A SEMICONDUCTOR DEVICE

(75) Inventors: Masami Shirosaki, Tokyo (JP); Junichi Tsuchimoto, Tokyo (JP); Kiyoshi Mori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/833,734

(22) Filed: Apr. 13, 2001

(65) Prior Publication Data

US 2001/0013620 A1 Aug. 16, 2001

Related U.S. Application Data

(62) Division of application No. 09/086,752, filed on May 29, 1998, now Pat. No. 6,232,628.

(30) Foreign Application Priority Data

Dec. 19, 1997 (JP) .............................................. 9-351210

(51) Int. Cl.$^7$ ............................................... H01L 21/20
(52) U.S. Cl. ........................ 438/398; 438/244; 438/255; 438/387
(58) Field of Search ................................ 438/244, 255, 438/387, 398, 253; 257/303, 308

(56) References Cited

U.S. PATENT DOCUMENTS

| | | | |
|---|---|---|---|
| 5,061,650 A | * 10/1991 | Dennison et al. ........... | 438/253 |
| 5,629,540 A | 5/1997 | Roh et al. .................... | 257/306 |
| 5,837,581 A | 11/1998 | Cheng ......................... | 438/255 |
| 5,994,181 A | * 11/1999 | Hsieh et al. ................. | 438/239 |
| 6,004,846 A | * 12/1999 | Lee ............................. | 438/255 |
| 6,046,093 A | * 4/2000 | DeBoer et al. ............. | 438/398 |
| 6,087,226 A | 7/2000 | Kim et al. .................... | 438/275 |
| 6,190,992 B1 | * 2/2001 | Sandhu et al. .............. | 438/398 |
| 6,197,653 B1 | * 3/2001 | Khamankar et al. ........ | 438/398 |

FOREIGN PATENT DOCUMENTS

JP        9-186297        7/1997

OTHER PUBLICATIONS

"A New Cylindrical Capacitor Using Hemispherical Grained Si (HSG–Si) for 256Mb DRAMs", by Watanabe, IEEE 1992.

* cited by examiner

*Primary Examiner*—George Fourson
*Assistant Examiner*—Julio J. Maldonado
(74) *Attorney, Agent, or Firm*—McDermott Will & Emery LLP

(57) ABSTRACT

In a semiconductor device comprising a cylindrical storage node, the surface area of the storage node is increased by forming silicone grains in an amorphous silicone film by a heat treatment only to an outer wall of the cylindrical portion to thereby form a roughened surface in the outer wall, and the amorphous silicone film is left in an inner wall without conducting a surface roughening treatment to the inner wall whereby the physical strength of the cylindrical portion is maintained and the destruction and the breakage of the cylindrical portion are prevented.

12 Claims, 5 Drawing Sheets

SEMICONDUCTOR DEVICE AND METHOD FOR PRODUCING A SEMICONDUCTOR DEVICE

This is a divisional of application No. 09/086,752, filed May 29, 1998, now U.S. Pat. No. 6,232,628.

BACKGROUND OF THE INVENTION

1. Field of the Invention

The present invention relates to a semiconductor device having a capacitor constituting a dynamic random access memory (DRAM) cell wherein the capacity of the capacitor is increased by roughening a surface of the cylindrical storage node, and a method for producing such semiconductor device.

2. Discussion of Background

FIG. 6 is a cross-sectional view of a conventional semiconductor device as disclosed in JP-A-9-186297. FIG. 6 shows mainly the structure of a cylindrical capacitor in cross section, which constitutes a DRAM cell. In FIG. 6, reference numeral 101 designates a semiconductor substrate, numeral 101a designates a source/drain region as a transistor element formed in a surface region of the semiconductor substrate 101, numeral 102 designates a device isolation oxide layer formed on the surface of the semiconductor substrate 101, a numeral 103 designates a word line formed on the semiconductor substrate 101 through a gate insulating film, which constitutes a gate electrode of the transistor element, numeral 104 designates an interlayer insulating film formed on the transistor element, numeral 105a designates a cylindrical storage node formed in contact with a source/drain region 101a between adjacent source/drain regions, which is provided with a cylindrical portion extending upward at a position on the interlayer insulating film 104, numeral 106 designates a dielectric film formed on the cylindrical storage node 105a, and numeral 107 designates a cell plate laminated to cover an outer surface of the dielectric film 106. The cylindrical storage node 105a, the dielectric film 106 and the cell plate 107 constitute a cylindrical capacitor 108.

In the conventional semiconductor device shown in FIG. 6, the surface area of the storage node is increased by forming a plurality of pin holes 105aa in a cylindrical portion of the cylindrical storage node 105a.

A silicon layer constituting the cylindrical storage node 105a is formed by using a vapor-phase epitaxy method at a temperature which is higher than a temperature for forming an amorphous structure but lower than a temperature for forming a polycrystalline structure while an impurity gas is introduced therein.

However, since thus formed silicon layer has crystallized portions in it, that portions are easily etched earlier than the other portion. Under such circumstances, when an anisotropic etching is conducted to the silicon layer having locality crystallized portions, only the crystallized portions are selectively removed whereby pin holes 105aa are formed.

Another conventional technique for forming a roughened surface is disclosed in JP-A-7-74268. FIG. 7 shows the structure of a semiconductor device in cross section formed by such technique.

In the cross-sectional view showing mainly the structure of a cylindrical storage node 105b, the cylindrical storage node 105b ham a cylindrical portion in which an inner wall and an upper surface of a bottom portion are roughened. Numeral 109 designates a bit line formed in contact with the other source/drain region 101a between the adjacent source/drain regions. Other reference numerals designate the same or corresponding part shown in FIG. 6. The reason why an outer wall of the cylindrical portion of the cylindrical storage node 105b is not roughened in the semiconductor device shown in FIG. 7, is to eliminate a disadvantage that when a heat treatment is conducted with use of a silane gas to obtain a roughened surface, spherical silicon grains having a uniform grain size are formed in the outer wall, and short circuit between adjacent storage nodes are caused. Further, there is another disadvantage that the formation of the silicon grains having a uniform grain size influences the formation of the dielectric film 106 and the cell plate 107 which are conducted subsequently.

In the conventional semiconductor device shown in FIG. 6, some of the pin holes 105aa penetrate from the outer wall to the inner wall of the cylindrical portion of the cylindrical storage node 105a. In this case, a sufficient physical strength can not be assured for the cylindrical storage node 105a, and there causes the destruction or the breakage of the cylindrical portion in subsequent processes.

In the conventional semiconductor device shown in FIG. 7, it was difficult to control the size of the silicon grains formed to obtain a roughened surface, and scattering of the silicon grain size was large whereby it was difficult to form a roughened surface in the cylindrical portion of the cylindrical storage node 105b.

It has been considered to control the scattering of the silicon grain size. With a demand of miniaturizing capacitor elements, the film thickness from the outer wall to the inner wall of the cylindrical portion has further been reduced. Under such circumstances, when both surfaces of the outer wall and the inner wall are to be roughened, silicon grains are entirely formed in the cylindrical portion whereby air gaps are resulted between adjacent silicon grains. In this case, the physical strength of the cylindrical portion can not be assured and there causes the destruction or the breakage of the cylindrical portion.

It has been considered to roughen both surfaces of the outer wall and the inner wall by controlling the grain size of the silicon grains to be mall. In this case, however, it is required to reduce the grain size of the silicon grains, and it is difficult to increase remarkably the surface area of the cylindrical portion.

SUMMARY OF THE INVENTION

It is an object of the invention to eliminate the above-mentioned disadvantages and to provide a semiconductor device having a cylindrical storage node which provides a sufficient physical strength and which increases the surface area by roughening the surface of the cylindrical portion.

In accordance with a first aspect of the invention, there is provided a semiconductor device which comprises a capacitor of a stacked structure including a cylindrical storage node, a dielectric film and a cell plate, wherein the storage node has a cylindrical portion and a bottom portion; an outer wall of the cylindrical portion which is in contact with the dielectric film has a roughened surface; and an inner wall of the cylindrical portion has a smoothed surface.

In a second aspect of the present invention, there is provided a semiconductor device according to the first aspect, wherein silicon grains are formed in the outer wall of the cylindrical portion to provide projections and recesses in the outer wall surface, and the inner wall is composed of amorphous silicon.

In a third aspect of the present invention, there is provided a semiconductor device according to the first aspect, wherein the dielectric film is formed on the outer wall, the inner wall and the bottom portion of the cylindrical storage node.

In a fourth aspect of the present invention, there is provided a semiconductor device according to the first aspect, wherein an insulating film is formed so as to be in contact with the inner wall and an upper surface of the bottom portion of the cylindrical portion of the cylindrical storage node, the insulating film constituting the core of the cylindrical portion, and the dielectric film is formed on the outer wall of the cylindrical portion.

In accordance with a fifth aspect of the present invention, there is provided a method for producing a semiconductor device having a cylindrical storage node comprising a bottom portion and a cylindrical portion which surrounds an outer circumference of the bottom portion and extends upward, which comprises a step of forming a contact hole which penetrates an interlayer insulating film formed on a semiconductor substrate; a step of forming an electric conductive film on the interlayer insulating film whereby the contact hole is filled to obtain a contact to the substrate; a step of forming an insulating film on the electric conductive film; a step of patterning by an anisotropic etching the insulating film and the electric conductive film to form a configuration corresponding to the cylindrical portion so that the core and the bottom portion of the cylindrical portion are formed; a step of forming the cylindrical portion on the side of the core and the bottom portion wherein an outer wall of the cylindrical portion is roughened; a step of removing the core; a step of forming a dielectric film to cover the cylindrical storage node comprising the cylindrical portion and the bottom portion; and a step of forming a cell plate on the dielectric film, whereby a capacitor constituted by the cylindrical storage node, the dielectric film and the cell plate is formed.

In accordance with a sixth aspect of the present invention, there is provided a method for producing a semiconductor device having a cylindrical storage node comprising a bottom portion and a cylindrical portion which surrounds an outer circumference of the bottom portion and extends upward, which comprises a step of forming a contact hole which penetrates an interlayer insulating film formed on a semiconductor substrate a step of forming an electric conductive film on the interlayer insulating film whereby the contact hole is filled to obtain a contact to the substrate; a step of forming an insulating film on the electric conductive film; a step of patterning by an anisotropic etching the insulating film and the electric conductive film to form a configuration corresponding to the cylindrical portion so that the core and the bottom portion of the cylindrical portion are formed; a step of forming the cylindrical portion on the side of the core and the bottom portion wherein an outer wall of the cylindrical portion is roughened; a step of forming a dielectric film on the cylindrical storage node comprising the cylindrical portion and the bottom portion; and a step of forming a cell plate on the dielectric film, whereby a capacitor constituted by the cylindrical storage node, the dielectric film and the cell plate is formed.

In a seventh aspect of the present invention, there is provided a method for producing a semiconductor device according to the fifth or the sixth aspect, wherein the step of forming the cylindrical portion on the side of the core and the bottom portion wherein an outer wall of the cylindrical portion is roughened, comprises forming amorphous silicon on the core and the bottom portion; roughening an outer surface of the amorphous silicon by forming silicon grains in the outer surface of it; and conducting an anisotropic etching for patterning to form a side-wall like cylindrical portion at the side of the core and the bottom portion.

In an eighth aspect of the present invention, there is provided a method for producing a semiconductor device according to the fifth or the sixth aspect, wherein the step of forming the cylindrical portion on the core and the bottom portion wherein an outer wall of the cylindrical portion is roughened, comprises forming amorphous silicon on the core and the bottom portion; conducting an anisotropic etching to form a side-wall like cylindrical portion at the side of the core and the bottom portion; and roughening an outer surface of the amorphous silicon by forming silicon grains in the outer surface of it to thereby form the cylindrical portion.

In a ninth aspect of the present invention, there is provided a method for producing a semiconductor device according to the seventh aspect or the eighth aspect, wherein the roughening of the outer surface of the amorphous silicon is selected from the group consisting of a heat treatment with use of silane and a heat treatment in vacuum after a treatment to the outer surface of the amorphous silicon with use of hydrofluoric acid, whereby projections and recesses are formed in the outer wall of the amorphous silicon by forming silicon grains in the outer wall.

In a tenth aspect of the present invention, there is provided a method for producing a semiconductor device according to the ninth aspect, wherein the inner wall of the cylindrical portion having a roughened outer wall is constituted by amorphous silicon.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
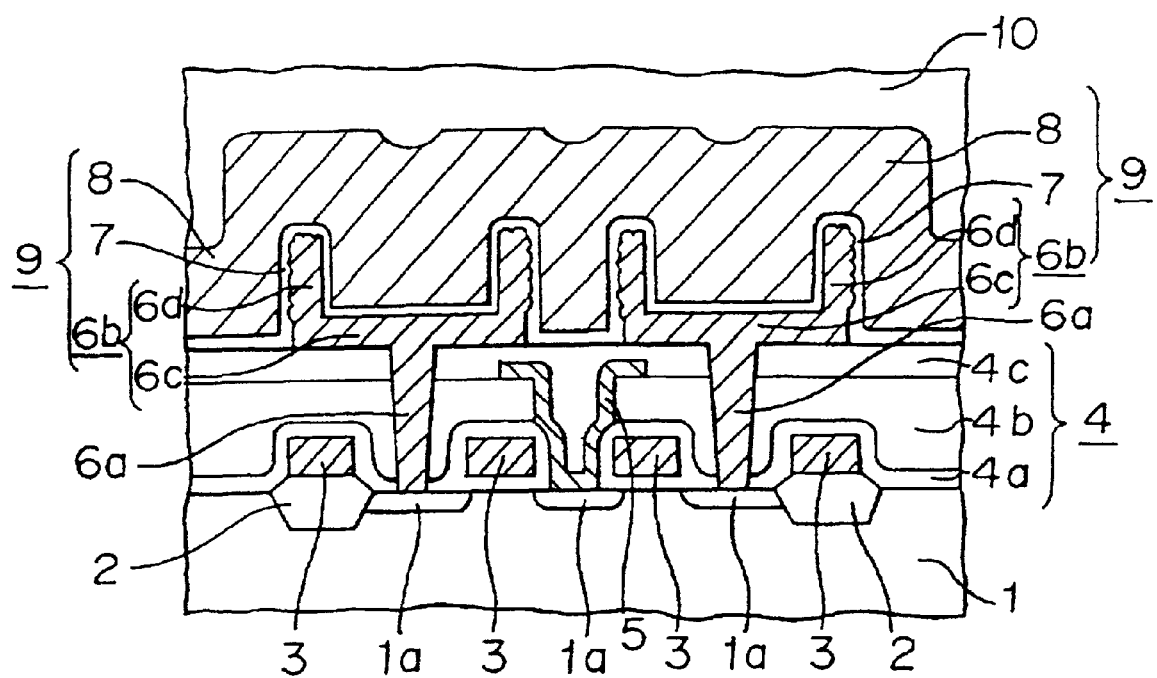
FIG. 1 is diagram showing a semiconductor device according to a first embodiment of the present invention.

Detailed description of preferred embodiments of the present invention will be described with reference to the drawings wherein the same reference numerals designate the same or corresponding parts.

EMBODIMENT 1

FIG. 1 is a diagram showing in cross section the structure of a semiconductor device formed according to the first embodiment of the present invention wherein cylindrical storage nodes for DRAM cells are mainly shown.

In FIG. 1, reference numeral 1 designates a semiconductor substrate, numerals 2 designate device isolation oxide layers formed in active regions in the semiconductor substrate, numerals 3 designate word lines as gate electrodes of transistor elements, which are formed by patterning through a gate insulating film, regions interposed by two source/drain regions formed in active regions in the semiconductor substrate 1; and numerals 4a, 4b and 4c designate interlayer insulating films which are subsequently laminated on the transistor elements. The interlayer insulating films 4a, 4b, 4c constitute an interlayer insulating film 4 as a whole. Further, a bit line 5 is formed penetrating the interlayer insulating films 4a and 4b so that the bit line 5 is in contact with one source/drain region 1a between adjacent source/drain regions 1a.

Further, a storage node contact 6a is formed penetrating the interlayer insulating film 4 so that it is in contact with the other source/drain region 1a, and the storage node contact 6a is formed integrally with a cylindrical storage node 6b which comprises a bottom portion 6c and a cylindrical portion 6d which surrounds the bottom portion 6c and extends upward. A dielectric film 7 is formed to cover the cylindrical storage node 6b and an outer surface of the interlayer insulating film 4. Further, a cell plate 8 is laminated on an outer surface of the dielectric film 7. A cylindrical capacitor 9 is constituted by the cylindrical storage node 6b, the dielectric film 7 and the cell plate 8. Further, an interlayer insulating film 10 is laminated on an outer surface of the capacitor 9.

In the semiconductor device shown in FIG. 1, an outer wall of the cylindrical portion 6d of the cylindrical storage node 6b is roughened so that the surface area of the outer wall is increased in comparison with a case without conducting a roughening operation.

A method for producing the semiconductor device shown in FIG. 1 will be described with reference to FIG. 2.

Figure 2A:
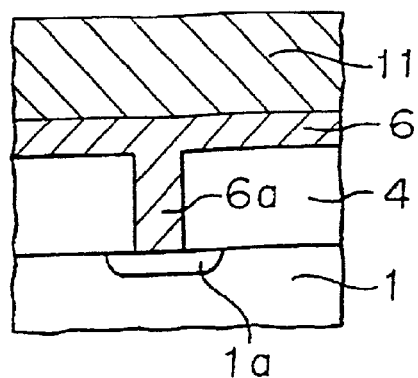
FIGS. 2a to 2e are diagrams showing manufacturing steps for the semiconductor device according to the first embodiment of the present invention.

First, the source/drain regions 1a and the other active elements are formed in the semiconductor substrate 1, and then, the interlayer insulating film 4 of about 0.15 μm thick is formed on the semiconductor substrate 1, as shown in FIG. 2a. A storage node contact hole is formed so as to penetrate the interlayer insulating film 4, and then, an amorphous silicon film 6 is laminated by a chemical vapor deposition method in a film thickness of about 0.15 μm. The formation of the amorphous silicon film 6 fills simultaneously the storage node contact hole, whereby the storage node contact 6a is obtainable.

Further, a silicon oxide film 11 is formed on the amorphous silicon film 6 to have a film thickness of about 0.50 μm. The silicon oxide film 11 becomes the core of the cylindrical portion 6d of the cylindrical storage node 6b by a process subsequently conducted. Accordingly, it is possible to adjust the film thickness depending on a dimension in a vertical direction of the cylindrical portion 6d.

In the next, a mask pattern having a shape corresponding to the bottom portion 6c of the cylindrical storage node 6b is formed on an outer surface of the silicon oxide film 11, and an anisotropic etching is conducted to the silicon oxide film 11 and the amorphous silicon film 6 by using the mask pattern as an etching mask, whereby the core 11a composed of the silicon oxide film is formed. At the same time, the bottom portion 6c of the cylindrical storage node 6b can be formed. Then, the mask pattern in removed.

Figure 2D:
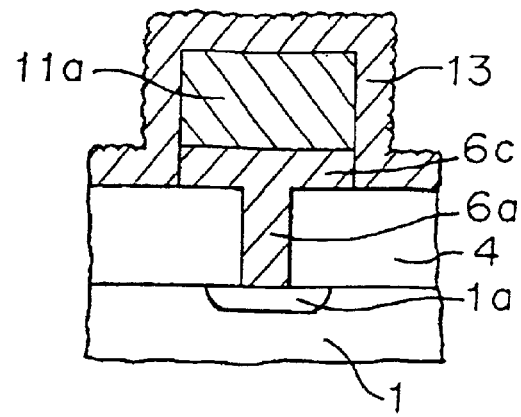
Figure 2B:
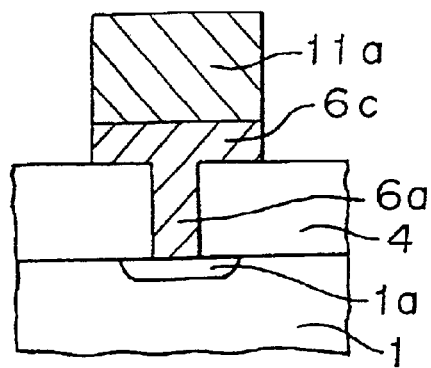
Figure 2E:
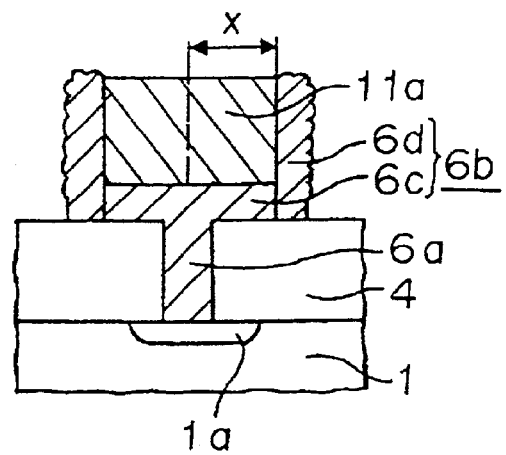
Figure 2C:
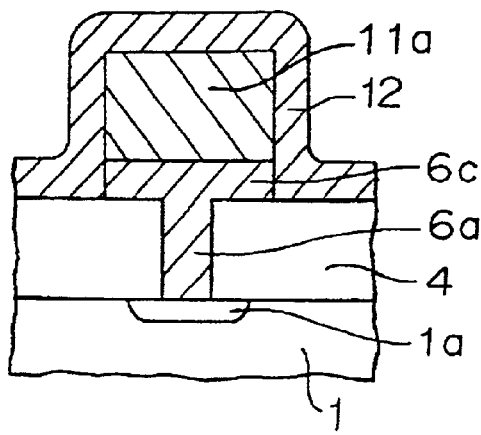

Then, an amorphous silicon film 12 having a film thickness of about 0.05 μm is formed by a CVD method on the core 11a and the bottom portion 6C as shown in FIG. 2c.

Then, as shown in FIG. 2d, a heat treatment as a roughening treatment is conducted to an outer surface of the amorphous silicon film 12 so that the amorphous silicon film 12 becomes to a roughened film 13.

The roughening treatment is described in detail in "a mechanism for forming hemispherical grained polysilicon" by Tatsumi et all. in Applied Physics Academy Magazine in 1992.

As one of the surface roughening techniques, there is proposed the formation of hemispherical grained polysilicon by annealing in vacuum. Namely, the surface of an amorphous silicon film is treated with hydrofluoric acid, and a heat treatment is conducted at 630° C. for a predetermined time under a ultra-vacuum condition whereby minute projections and recesses of a grain size of 10 nm to 50 nm are formed. A grain size of 50 nm generally corresponds to the film thickness of the formed amorphous silicon film 12. However, each silicon grains is in a hemispherical shape, and accordingly, silicon grains do not reach the inner wall of the cylindrical portion, in the inner wall and the amorphous silicon film is remained.

As another surface roughening technique, there is proposed such technique that the temperature of the substrate is kept about 590° C. and a $Si_2H_6$ gas is introduced so as to conduct nucleation on the outer surface of the amorphous silicon film 12. In this technique, it is possible to adjust conditions for treatment such as a substrate temperature, a gas introducing time and so on depending on a diameter of silicon grains to be formed.

Then, as shown in FIG. 2e, an anisotropic etching is conducted to the roughened film 13 so that only a portion of the roughened film 13 attached to a side surface of the core 11a and the bottom portion 6c is left, which is called, the cylindrical portion 6d. Thus, the bottom portion 6c and the cylindrical portion 6d constitute a cylindrical storage node 6b.

After the formation of the cylindrical storage node 6b, the core 11a is removed, followed by forming successively the dielectric film 7 and the cell plate 8 whereby the capacitor 9 as shown in FIG. 1 can be obtained.

In the cylindrical storage node 6b of the thus formed semiconductor device, a surface roughening treatment can be conducted only from an outer wall side of the cylindrical portion 6d to form the silicon grains. Accordingly, relatively large silicon grains can be formed even in a case that the film thickness of the amorphous silicon film 12 is small. Accordingly, it is possible to increase the outer surface area of the cylindrical storage node 6b.

Figure 3:
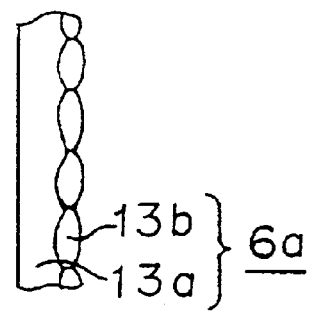
FIG. 3 is a diagram necessary for explaining the first embodiment of the present invention.

FIG. 3 is an enlarged view showing in cross section of the structure of the cylindrical portion 6d. The cylindrical portion 6d comprises the amorphous silicon film 13a and silicon grains 13b.

As shown in FIG. 3, the amorphous silicon film 13a remains without discontinuation in the inner wall of the cylindrical portion 6d, and surface of the amorphods silicon film 13a is smooth. The remaining amorphous silicon film 13a is sufficient to keep the physical strength of the cylindrical portion 6b even after the formation of the silicon grains 13b.

Assuming that the cylindrical storage node 6b is in a cylindrical form having a radius (x) of 0.40 μm and the film thickness from the outer wall to the inner wall of the cylindrical portion 6d is 0.05 μm, and further assuming that the surface area of the outer wall of the cylindrical portion which has been subject to the surface roughening treatment is 2.5 times as large as the surface area before the surface roughening treatment, the surface area of the storage node can be increased 1.67 times as a whole.

Further, in the semiconductor device according to the first embodiment of the present invention, it is possible to conduct the surface roughening treatment subsequently after the formation of the amorphous silicon film 12 constituting the cylindrical portion 6d. Accordingly, there is no danger of contamination of the amorphous silicon film surface after the treatment, and the formation of projections and recesses can effectively be formed by the surface roughening treatment.

EMBODIMENT 2

Description will be made as to the second embodiment of the present invention.

In the above-mentioned first embodiment, the surface roughening treatment is conducted after the formation of the amorphous silicon film which forms the cylindrical portion of the storage node, and then, an etching-back treatment is conducted so as to obtain the cylindrical portion. In the second embodiment, however, the surface roughening treatment is conducted after the etching-back treatment is conducted to the amorphous silicon film to obtain the cylindrical portion. The finally obtainable structure of the semiconductor device is the same as shown in FIG. 1.

Figure 4:
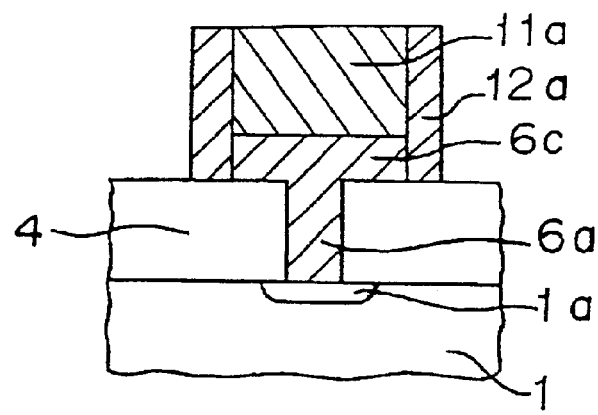
FIGS. 4a and 4b are diagrams showing a semiconductor device according to a second embodiment of the present invention.
Figure 4:
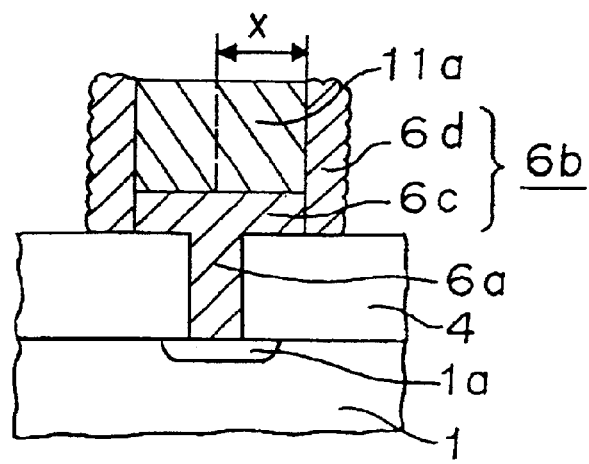

In the second embodiment, operations are conducted in the same manner as illustrated in FIGS. 2a to 2c in the first embodiment. Then, as shown in FIG. 4a, an anisotropic etching is conducted to the amorphous silicon film 12 so that the amorphous silicon film 12 is left as a side-wall like cylindrical portion 12a which is attached to a side portion of the core 11a and the bottom portion 6c.

Then, a heat treatment as the surface roughening treatment is conducted in the same manner as described in the first embodiment whereby an outer surface area of the cylindrical portion 6d is increased. In this case, the outer surface at a lower position of the cylindrical portion 6d and near an upper surface of the interlayer insulating film 4, which has not been roughened in the first embodiment, can be roughened.

Assuming that the cylindrical storage node 6b is in a cylindrical form having a radius (x) of 0.40 μm and the film thickness from the outer wall to the inner wall of the cylindrical portion 6d is 0.05 μm, and further the assuming that the surface area of a roughened outer wall of the cylindrical portion is 2.5 times as large as that without having a roughed outer wall, the surface area of the storage node can be increased 1.74 times as a whole.

Thus, it is possible to conduct the surface roughening treatment after the formation of the cylindrical portion 6d. In this case, the surface area of the storage node can be increased while the physical strength of the cylindrical storage node 6b can be provided and a capacitor 9 of larger capacity can be obtained, in the same manner as in the first embodiment.

EMBODIMENT 3

The third embodiment of the present invention will be described.

In the first and second embodiments, the silicon oxide film which is used as the core 11a is removed in forming the cylindrical portion 6d which constitutes the cylindrical storage node 6b. In the third embodiment, however, the core 11a is used without removing.

Figure 5:
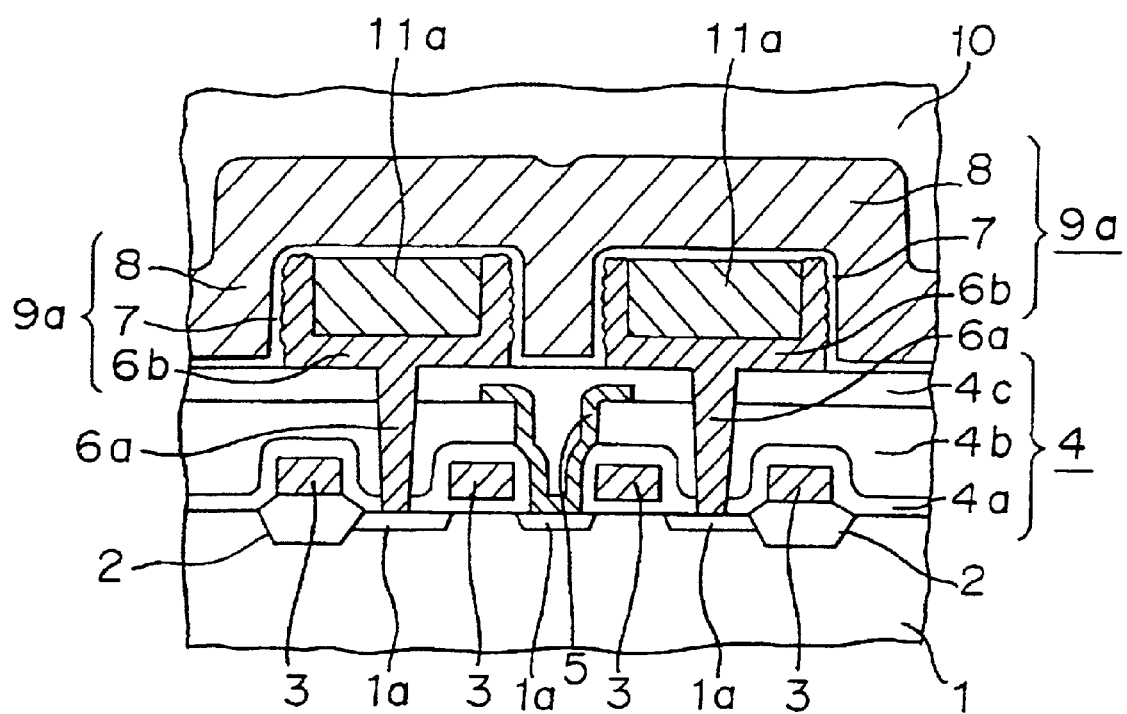
FIG. 5 is a diagram showing a semiconductor device according to a third embodiment and a fourth embodiment of the present invention.
Figure 6:
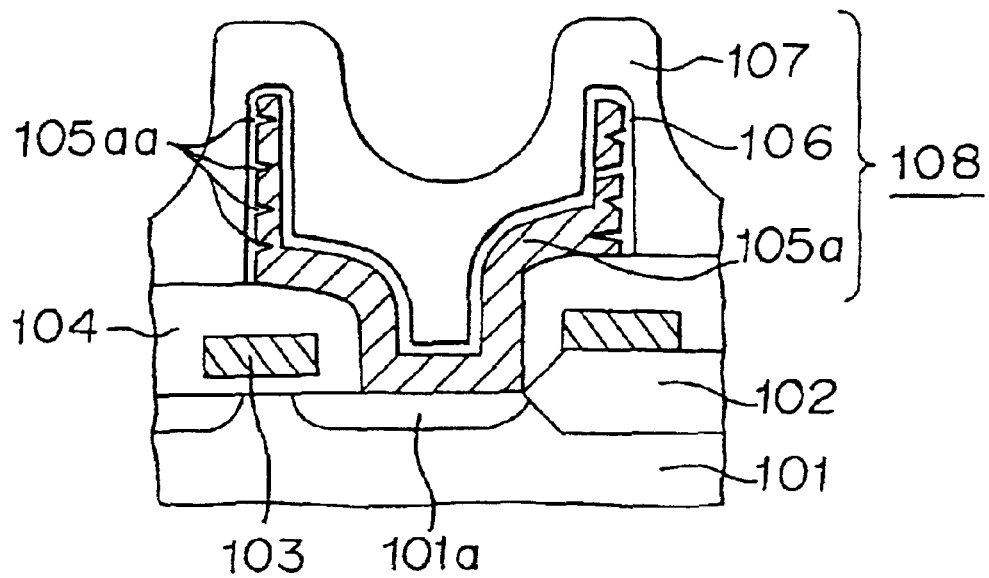
FIG. 6 is a diagram showing a conventional semiconductor device.
Figure 7:
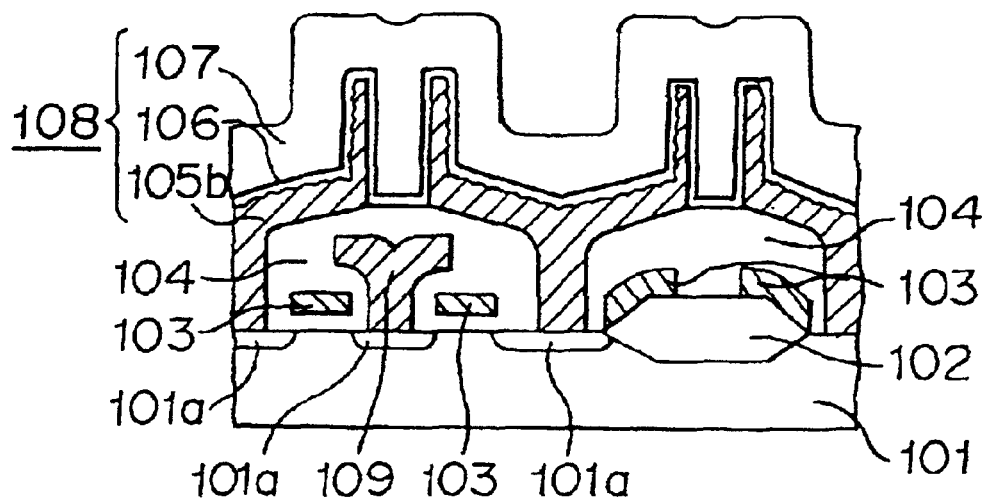
FIG. 7 is a diagram showing another conventional semiconductor device.

FIG. 5 is a diagram showing in cross section of the semiconductor device according to the third embodiment wherein numeral 9a designates a capacitor in which the inner wall and an inner surface of the bottom portion of the cylindrical portion 6d of the cylindrical storage node 6b are not used as an opposing electrode, and only the outer wall is used as an opposing electrode and wherein the core 11a is left inside the cylindrical storage node 6b.

In a method for producing the semiconductor device shown in FIG. 5, the cylindrical storage node 6b and the core 11 are formed in accordance with the processes as shown in FIG. 2a to 2e in the same manner as the first embodiment. In the third embodiment, however, the core 11a is not removed and the dielectric film 7 is formed to cover the capacitor 9a and the core 11a. Then, the cell plate 8 is formed to cover the dielectric film 7.

In the semiconductor device shown in FIG. 5, the outer wall of the cylindrical portion 6d constituting the cylindrical storage node 6b is selectively roughened whereby the outer surface area of the storage node can be increased in comparison with a case that the surface roughening treatment is not conducted to the outer wall.

In the semiconductor device shown in FIG. 5, it is impossible for the capacitor 9a to use as an opposing electrode the inner wall of the cylindrical portion 6d and the bottom portion of the cylindrical storage node 6b. However, assuming that the cylindrical storage node 6b is a cylindrical form having a radius (x) of 0.40 μm and the surface area of the outer wall is increased 2.5 times by the surface roughening treatment, the surface area which can be used for the storage node can be increased 1.2 times as large as a case without conducting the surface roughening treatment to the outer wall.

Further, in this embodiment, since a heat treatment for surface roughening is conducted subsequent to the formation of the amorphous silicon film, the contamination to the treated surface can be prevented and fine projections and recesses can effectively be formed in the outer surface of the cylindrical portion.

Further, since the roughed surface is formed by growing silicon grains only in the outer surface of the cylindrical portion, and the growing of the silicon grains does not reach the inner wall, the formation of air gaps between silicon grains can be eliminated. Further, the physical strength of the cylindrical portion can be assured by leaving the core 11a in the cylindrical storage node 6b.

EMBODIMENT 4

In the next, the fourth embodiment of the present invention will be described.

The semiconductor device obtained by the fourth embodiment has substantially the same construction as that shown in FIG. 5 concerning the third embodiment, however, there is a difference in the method for producing the same.

Although the cylindrical storage node 6b of the semiconductor device according to the third embodiment is produced in the same manner as that according to the first embodiment, the cylindrical storage node 6b of the semiconductor device according to the fourth embodiment is prepared according to the processes shown in FIGS. 4a and 4b in the same manner as the method producing the semiconductor device described in the second embodiment wherein the cylindrical portion 12a of amorphous silicon is formed in a side-wall like form in a side potion of the core 11a, followed by conducting a heat treatment for surface roughening. In the fourth embodiment, the core 11a is not removed.

Since the core 11a is left in this embodiment, the inner wall of the cylindrical portion 6d and the bottom portion of the storage node 6b can not be used as an opposing electrode. However, the outer wall of the cylindrical portion 6d is roughened, and accordingly, the surface area of the outer surface as an electrode can be increased as the whole in the cylindrical storage node 6b.

In this embodiment, the surface roughening treatment to the outer wall of the cylindrical portion 6d is conducted after the formation of the cylindrical portion 6d. Therefore, it is possible to form a roughened surface in a lower portion of the cylindrical portion 6d which is near an upper surface of the interlayer insulating film 4, which has not been roughened in the third embodiment. Accordingly, the surface area of the cylindrical storage node 6b can further be increased. For example, when the cylindrical portion 6d is a cylindrical form having a radius (x) of 0.40 µm and the surface area of the outer wall is increased 2.5 times by the roughening treatment, the surface area of the outer wall can be increased 1.26 times in comparison with a case without conducting the roughening treatment.

In the fourth embodiment of the present invention, the roughened surface is formed by growing silicon grains only in the outer wall of the cylindrical portion 6b to an extent that the growth of the silicon grains does not reach the inner wall. Accordingly, the formation of air gaps between the silicon grains can be suppressed. Further, since the core 11a is left in the cylindrical storage node 6b, the physical strength of the cylindrical portion 6b can be assured.

In accordance with the semiconductor device in the first aspect of the present invention, the outer wall of the cylindrical storage node is roughened and inner wall is not roughened. Accordingly, it is possible to increase the surface area of the storage node while a sufficient physical strength of the cylindrical portion can be assured.

Further, in the semiconductor device according to the second aspect, the surface roughening treatment is conducted by forming silicon grains only in the outer wall wherein the size of the silicon grains is increased to thereby increase the surface area of the outer wall. Further, silicon grains are not formed in the inner wall where an amorphous silicon layer is remained. Accordingly, the formation of air gaps between silicon grains can be suppressed and the physical strength of the cylindrical portion can be maintained.

In the semiconductor device of the third aspect, in addition to the advantage described in the first aspect, the capacity of the capacitor can further be increased since the inner wall and the bottom portion of the cylindrical storage node is used as an electrode of the capacitor.

In the semiconductor device of the fourth aspect, in addition to the advantage described in the second aspect, the physical strength of the cylindrical portion can certainly be maintained and the destruction and the breakage of the cylindrical portion can be avoided since the insulating layer which is used as the core of the cylindrical portion is left without removing from the cylindrical storage node.

In the method for producing a semiconductor device according to the fifth aspect of the present invention, since the cylindrical portion in which only the outer wall is roughened is formed as a structural element of the cylindrical storage node, the surface area of the capacitor can be increased, and the physical strength of the cylindrical portion can be assured because the inner wall of the cylindrical portion is not roughened. Further, the insulating layer used as the core of the cylindrical portion when the cylindrical portion is formed, is removed, the inner wall and the bottom portion of the cylindrical storage node are used as an opposing electrode.

In the method for producing a semiconductor device according to the sixth aspect, since the cylindrical portion in which only the outer wall is roughened is formed as a structural element of the cylindrical storage node, the surface area of the capacitor can be increased, and the physical strength of the cylindrical portion can be assured because the inner wall of the cylindrical portion is not roughened.

In the seventh aspect of the present invention, the cylindrical portion having its roughened side wall is formed by forming an amorphous silicon film on the entire surface of the core; roughening the outer surface of the amorphous silicon film, and conducting an anisotropic etching for patterning to obtain the cylindrical portion in a side-wall form attached to the core.

According to the eighth aspect of the present invention, the cylindrical portion having the roughened outer wall is formed by forming an amorphous silicon film on the side surface of the core in a side-wall form and roughening the outer surface of the amorphous silicon film.

According to the ninth aspect of the present invention, the amorphous silicon film is roughened by a heat treatment with use of silane or $Si_2H_6$, or by a treatment with a hydrofluoric acid followed by heat treatment in vacuum. In either method, silicon grains can be formed to increase the surface area with good controllability. Further, in either method for surface roughening, an excellent roughened surface is obtainable without contamination of the surface to be treated for surface roughening.

In the tenth aspect of the present invention, the amorphous silicon film remains in the inner wall of the cylindrical portion and any air gaps are not formed in the inner wall. Accordingly, it is possible to maintain the physical strength of the cylindrical portion.

Obviously, numerous modifications and variations of the present invention are possible in light of the above teachings. It is therefore to be understood that within the scope of the appended claims, the invention may be practiced otherwise than as specifically described herein.

What is claimed is:

1. A method for producing a semiconductor device having a cylindrical storage node comprising a bottom portion and a cylindrical portion which surrounds an outer circumference of said bottom portion and extends upward, which comprises the steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising the sequential steps of forming a film made of amorphous silicon on said core and said bottom portion; roughening an outer surface of said film by forming silicon grains in the outer surface of it; and conducting an anisotropic etching for patterning to form said cylindrical portion having a side-wall like shape at the side of said core and said bottom portion;

removing said core;

forming a dielectric film to cover said cylindrical storage node comprising said cylindrical portion and said bottom portion; and forming a cell plate on said dielectric film, whereby a capacitor constituted by said cylindrical storage node, said dielectric film and said cell plate is formed, wherein said method for producing a semiconductor device is performed such that the inner wall of the cylindrical portion having the roughened outer wall remains in a form of said amorphous silicon.

2. The method for producing a semiconductor device according to claim 1, wherein the roughening of the outer surface of the film is selected from the group consisting of a heat treatment with use of silane and a heat treatment in vacuum after a treatment to the outer surface of said film with use of hydrofluoric acid, whereby projections and recesses are formed in the outer surface of said film by forming silicon grains in the outer surface.

3. A method for producing a semiconductor device having a cylindrical storage node comprising a bottom portion and a cylindrical portion which surrounds an outer circumference of said bottom portion and extends upward, which comprises the steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising forming a film made of amorphous silicon on said core and said bottom portion; conducting an anisotropic etching of said film to form said cylindrical portion having a side-wall like shape at the side of said core and said bottom portion; and roughening said outer wall of said cylindrical portion by forming silicon grains;

removing said core;

forming a dielectric film to cover said cylindrical storage node comprising said cylindrical portion and said bottom portion; and forming a cell plate on said dielectric film, whereby a capacitor constituted by said cylindrical storage node, said dielectric film and said cell plate is formed, wherein said method for producing a semiconductor device is performed such that the inner wall of the cylindrical portion having the roughened outer wall remains in a form of said amorphous silicon.

4. The method for producing a semiconductor device according to claim 3, wherein the roughening of the outer wall of the cylindrical portion is selected from the group consisting of a heat treatment with use of silane and a heat treatment in vacuum after a treatment to the outer wall of said cylindrical portion with use of hydrofluoric acid, whereby projections and recesses are formed in the outer wall of said cylindrical portion by forming silicon grains in the outer wall.

5. The method for producing a semiconductor device according to claim 3, wherein the anisotropic etching of said amorphous silicon is conducted so as to cover whole circumferential areas of said core and said bottom portion by said cylindrical portion, and whole the outer wall of the cylindrical portion covering the whole circumferential areas of said core and said bottom portion is roughened.

6. A method for producing a semiconductor device having a cylindrical storage node comprising a bottom portion and a cylindrical portion which surrounds an outer circumference of said bottom portion and extends upward, which comprises steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising the steps of forming a film made of amorphous silicon on said core and said bottom portion; roughening, an outer surface of said film by forming silicon grains in the outer surface of it; and conducting an anisotropic etching for patterning to form said cylindrical portion having a side-wall like shape at the side of said core and said bottom portion;

forming a dielectric film on said cylindrical storage node comprising said cylindrical portion and said bottom portion within which said core remains; and forming a cell plate on said dielectric film, whereby a capacitor constituted by said cylindrical storage node, said dielectric film and said cell plate is formed, wherein said method for producing a semiconductor device is performed such that the inner wall of the cylindrical portion having the roughened outer wall remains in a form of said amorphous silicon.

7. The method for producing a semiconductor device according to claim 6, wherein the roughening of the outer surface of the film is selected from the group consisting of a heat treatment with use of silane and a heat treatment in vacuum after a treatment to the outer surface of said film with use of hydrofluoric acid, whereby projections and recesses are formed in the outer surface of said film by forming silicon grains in the outer surface.

8. The method for producing a semiconductor device according to claim 6, wherein the steps of forming the film made of amorphous silicon on said core and said bottom portion; roughening the outer surface of said film by forming silicon grains in the outer surface of it; and conducting an anisotropic etching for patterning to form said cylindrical portion having the side-wall like shape at the side of said core and said bottom portion are sequentially created out.

9. A method for producing a semiconductor device having a cylindrical storage node comprising a bottom portion and a cylindrical portion which surrounds an outer circumference of said bottom portion and extends upward, which comprises steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising the steps of forming a film made of amorphous silicon on said core and said bottom portion; conducting an anisotropic etching of said film to form said cylindrical portion having a side-wall like shape at the side of said core and said bottom portion; and roughening said outer wall of said cylindrical portion by forming silicon grains, forming a dielectric film on said cylindrical storage node comprising said cylindrical portion and said bottom portion within which said core remains; and forming a cell plate on said dielectric film, whereby a capacitor constituted by said cylindrical storage node, said dielectric film and said cell plate is formed, wherein said method for producing a semiconductor device is performed such that the inner wall of the cylindrical portion haying the roughened outer wall remains in a form of said amorphous silicon.

10. The method for producing a semiconductor device according to claim 9, wherein the roughening of the outer wall of said cylindrical portion is selected from the group consisting of a heat treatment with use of silane and a heat treatment in vacuum after a treatment to the outer wall of said cylindrical portion with use of hydrofluoric acid, whereby projections and recesses are formed in the outer wall of said cylindrical portion by forming silicon grains in the outer wall.

11. A method for producing a semiconductor device having a cylindrical storage node comprising a bottom portion and a cylindrical portion which surrounds an outer circumference of said bottom portion and extends upward, which comprises the steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising the steps of forming a film made of amorphous silicon on said core and said bottom portion; roughening an outer surface of said film by forming silicon grains in the outer surface of it; and conducting an anisotropic etching for patterning to form said cylindrical portion having a side-wall like shape at the side of said core and said bottom portion;

removing said core;

forming a dielectric film to cover said cylindrical storage node comprising said cylindrical portion and said bottom portion; and forming a cell plate on said dielectric film, whereby a capacitor constituted by said cylindrical storage node, said dielectric film and said cell plate is formed, wherein said method for producing a semiconductor device is performed such that the inner wall of the cylindrical portion having the roughened outer wall remains in a form of said amorphous silicon.

12. A method for producing a semiconductor device having a cylindrical storage node comprising a bottom portion and a cylindrical portion which surrounds an outer circumference of said bottom portion and extends upward, which comprises the steps of:

forming a contact hole which penetrates an interlayer insulating film formed on a semiconductor substrate;

forming an electric conductive film on said interlayer insulating film whereby said contact hole is filled to obtain a contact to said substrate;

forming an insulating film on said electric conductive film;

patterning by an anisotropic etching said insulating film and said electric conductive film to form a configuration corresponding to said cylindrical portion so that a core and the bottom portion of said cylindrical portion are formed;

forming the cylindrical portion on the side of said core and said bottom portion wherein an outer wall of said cylindrical portion is roughened, comprising forming a film made of amorphous silicon on said core and said bottom portion; conducting an anisotropic etching of said film to form said cylindrical portion having a side-wall like shape at the side of said core and said bottom portion so as to cover whole circumferential areas of said core and said bottom portion by said cylindrical portion; and roughening whole said outer wall of said cylindrical portion covering the whole circumferential areas of said core and said bottom portion by forming silicon grains;

removing said core;

forming a dielectric film to cover said cylindrical storage node comprising said cylindrical portion and said bottom portion; and forming a cell plate on said dielectric film, whereby a capacitor constituted by said cylindrical storage node, said dielectric film and said cell plate is formed, wherein said method for producing a semiconductor device is performed such that the inner wall of the cylindrical portion having the roughened outer wall remains in a form of said amorphous silicon.

* * * * *